United States Patent [19]
Fujita et al.

[11] Patent Number: 5,117,383
[45] Date of Patent: May 26, 1992

[54] DIGITAL SIGNAL PROCESSING CIRCUIT USING A RESIDUE NUMBER SYSTEM

[75] Inventors: Tadao Fujita; Yoshiaki Inaba, both of Kanagawa; Jun Takayama, Tokyo, all of Japan

[73] Assignee: Sony Corporation, Tokyo, Japan

[21] Appl. No.: 556,430

[22] Filed: Jul. 24, 1990

[30] Foreign Application Priority Data

Jul. 29, 1989 [JP] Japan .................. 1-197593

[51] Int. Cl.$^5$ .............................. G06F 7/72
[52] U.S. Cl. ................................... 364/746
[58] Field of Search ............ 364/746, 724.01, 745, 364/746.1

[56] References Cited

U.S. PATENT DOCUMENTS

| | | | |
|---|---|---|---|
| 4,041,284 | 8/1977 | Bond | 364/746 |
| 4,589,084 | 5/1986 | Fling et al. | 364/745 |
| 4,598,266 | 7/1986 | Bernardson | 364/746 |
| 4,831,576 | 5/1989 | Kunimoto | 364/745 |
| 4,910,699 | 3/1990 | Capps et al. | 364/746 |
| 4,949,293 | 8/1990 | Kawamura et al. | 364/746 |
| 4,949,294 | 8/1990 | Wambergue | 364/746 |

FOREIGN PATENT DOCUMENTS 1-126829 5/1989 Japan.

OTHER PUBLICATIONS

Garner, Harvey L., IRE Transactions on Electronic Computers, "The Residue Number System", EL-8, No. 6, Jun. 1959, pp. 140-147.
Taylor, Fred J., "Residue Arithmetic: A Tutorial With Examples", IEEE Computer vol. 17, No. 5, May 1984, pp. 50-61.
W. Jenkins et al., "The Use of Residue Number Systems in The Design of Finite Impulse Response Digital Filters", IEEE Trans. on Circuits and Systems, vol. CAS-24, No. 4, Apr. 1977, pp. 191-201.
W. Jenkins, "Recent Advances in Residue Number Techniques for Recursive Digital Filtering", IEEE Trans, on Acoustics, Speech, and Signal Processing, vol. ASSP-27, No. 1, Feb. 1979, pp. 19-30.

Primary Examiner—Long T. Nguyen
Attorney, Agent, or Firm—Ronald P. Kananen

[57] ABSTRACT

A digital signal processing circuit of a so-called RNS system in which a residue number system ("RNS") encoder for converting input data into RNS code data is provided with a converter for connecting the input data into a multiple of one or more of the moduli of the RNS code. The converter is operated in the case of occurrence of trouble in the processing system of the modulus to locate the site of the trouble on the basis of the output of the digital signal processing circuit.

11 Claims, 5 Drawing Sheets

|  | DG<sub>IN2</sub> | | | | | | | |
|---|---|---|---|---|---|---|---|---|
| | | 0 | 1 | 2 | 3 | 4 | 5 | 6 | 7 |
| D<sub>RN3</sub> | 1 | 0 | 0 | 0 | 0 | 0 | 0 | 0 | 1 |
| | 2 | 0 | 0 | 0 | 0 | 0 | 0 | 1 | 1 |
| | 3 | 0 | 0 | 0 | 0 | 0 | 1 | 1 | 1 |
| | 4 | 0 | 0 | 0 | 0 | 1 | 1 | 1 | 1 |
| | 5 | 0 | 0 | 0 | 1 | 1 | 1 | 1 | 1 |
| | 6 | 0 | 0 | 1 | 1 | 1 | 1 | 1 | 1 |
| | 7 | 0 | 1 | 1 | 1 | 1 | 1 | 1 | 1 |

DIGITAL SIGNAL PROCESSING CIRCUIT USING A RESIDUE NUMBER SYSTEM

BACKGROUND OF THE INVENTION

1. Field of the Invention

This invention relates to a digital signal processing circuit making use of the so-called residue number system ("RNS") system in which the input data expressed by the binary code is processed after conversion thereof into the RNS code which represents the input data by the combination of residues obtained by dividing the input data by plural moduli.

2. Description of the Prior Art

As a digital signal processing circuit, a system of an arithmetic operation making use of the RNS system has been proposed in H. L. Garner, "The Residue Number System", IRE Transactions on Electronic Computers, vol. EL-8, No. 6, June 1959, pages 140 to 147 or in F. J. Taylor, "Residue Arithmetic: A Tutorial With Examples", IEEE Computer, vol. 17, No. 5, May 1984, pages 50 to 61.

With the digital signal processing system making use of the RNS system, the input data represented by the binary code is converted into the RNS code in which the input data is represented by combination of residues obtained upon dividing the input data by plural moduli, and the modulo operation is performed in each of the systems allocated to the respective moduli, so that the carry operation (such as in a binary operation operation) becomes unnecessary to perform at the time of the arithmetic operation. Hence, digital signals can be processed more accurately and at a higher processing speed.

As a digital signal processing system making use of the above mentioned RNB system, there is a digital filter system, as disclosed in "Treatises of Electric Communication Association," '84/4 vol. J67-1, No. 4, pages 536 to 543.

The digital filter apparatus making use of the above mentioned RNS system is constructed as shown in FIG. 1.

The digital filter apparatus of the RNS system shown in FIG. 1 is constituted by an encoder section 40 to which a digital video signal $D_{BI}$ represented by the binary code is entered, a filter section 60 to which an output of the encoder section 40 is entered, and a decoder section 60 to which an output of the filter section 50 is supplied.

The encoder section 40 is constituted by (n+1) encoders 41, 42, . . . , each of which is formed by a read only memory (ROM) conversion table. The conversion table employed in the above encoders 41, 42, . . . , is constituted by a ROM into which are written residue data $R_0, R_1, R_2, \ldots, R_n$ which are obtained by dividing the binary code data by (n+1) positive integers that are prime numbers with respect to one another and which are associated with the moduli $m_0, m_1, m_2, \ldots, m_n$, respectively.

The digital video signal $D_{BI}$ represented in the binary code, entered into the encoder section 40, is inverted by the encoders 41, 42, . . . making use of the conversion table, into the residue data $R_0, R_1, R_2, \ldots, R_n$, associated with the moduli $m_0, m_1, m_2, \ldots, m_n$, respectively.

When the digital video signal $D_{BI}$ is entered into the encoder section 40, the RNS code data $D_{RI}$ represented by the combination of the residue data $R_0, R_1, R_2, \ldots, R_n$ produced by the encoders 41, 42, . . . is output from the encoder section 40.

The RNS code data $D_{RI}$, output by the encoder section 40, is supplied to the filter section 50.

The filter section 50 is constituted by (n+1) digital filter circuits 51, 52, . . . associated with the coefficients $m_0, m_1, m_2, \ldots, m_n$ respectively. Each of the digital filter circuits 51, 52, . . . processes the RNS code data $D_{RI}$ supplied from the encoder section 40 by a modulo operation for affording the desired same filter characteristics to each of the above residue data $R_0, R_1, R_2, \ldots, R_n$, that is, to each of the moduli $m_0, m_1, m_2, \ldots, m_n$. Meanwhile, the digital filter circuit 51 performs an arithmetic modulo operation on the residue data $R_0$, the digital filter circuit 52 performs an arithmetic modulo operation on the residue data $R_1$, and so forth, so that each of the digital filter circuits performs a modulo operation for each of the residue data allocated thereto.

That is, in the filter section 50, each of the digital filter circuits 51, 52, . . . processes the RNS code data $D_{RI}$ represented by the combination of the residue data $R_0, R_1, R_2, \ldots, R_n$ by a separate modulo operation for each of the moduli $m_0, m_1, m_2, \ldots, m_n$, so that the residue data having desired filter characteristics are formed by the digital filter circuits 51, 52, . . . The filter section 50 outputs RNS code data $D_{RO}$ represented by the combination of the residue data obtained by the digital filter circuits 61, 62, . . . .

The RNS code data $D_{RO}$, output by the filter section 50, is supplied to the decoder section 60.

The decoder section 60 is constituted by a conversion table formed by a ROM. The conversion table employed in the decoder section 60 is constituted by a ROM in which the binary code data corresponding to the PNB code data are written as the conversion table data.

This decoder section 60 outputs the RNS code data $D_{RO}$ supplied from the filter section 60 after conversion into corresponding binary code data $D_{BO}$ by the above conversion table.

It is noted that the above RNS code data may be converted into the binary code data based on, for example, Son's residue theorem.

According to Son's residue theorem, if the residue $r_i$ of x by a modulus $m_i$ is expressed by a formula (1)

$$r_i = x \bmod m_i \tag{1}$$

by using a symbol mod, the RNS code data $D_{RO}$ is expressed by the combination of residue data $R_0, R_1, R_2, \ldots, R_n$ by positive integers $m_0, m_1, m_2, \ldots, m_n$, that are prime numbers with respect to a positive integer, and the RNS code data may be demodulated into binary code data having the value B by solving the formula (5)

$$B = \left( \sum_{i=0}^{n} R_i \cdot N_i \cdot M_i \right) \bmod m_i \tag{5}$$

from the values $M, M_i$ and $N_i$ represented by the formulas (2), (3) and (4)

$$M = \prod_{i=0}^{n} m_i \tag{2}$$

-continued $$M_i = \frac{M}{m_i} \quad (3)$$

$$1 = N_i M_i \bmod m_i \quad (4)$$

The decoder section 60 may be constituted by using a ROM conversion table in which the thus produced binary code data are written as the conversion table data.

In the above described digital filter apparatus shown in FIG. 1, with n=4, $m_0=7$, $m_1=11$, $m_2=13$, $m_3=15$ and $m_4=16$, as an example, the relation of correspondence between the binary code data $D_B$ and the RNS code data $D_R$ may be represented as shown in the following Table 1.

TABLE 1

Relation of Correspondence Between Binary Code Data $D_B$ and RNS Code Data $D_R$ with $m_0=7$, $m_1=11$, $m_2=13$, $m_3=15$ and $m_4=16$

| Binary Code Data $D_B$ | | | | | | RNS Code Data $D_R$ | | | | |
|---|---|---|---|---|---|---|---|---|---|---|
| | | | | | | $m_0$ | $m_1$ | $m_2$ | $m_3$ | $m_4$ |
| | | | | | 0 | 0 | 0 | 0 | 0 | 0 |
| | | | | | 1 | 1 | 1 | 1 | 1 | 1 |
| | | | | | 2 | 2 | 2 | 2 | 2 | 2 |
| | | | | | 7 | 0 | 7 | 7 | 7 | 7 |
| 1 | 0 | 0 | 0 | 0 | 0 | 5 | 10 | 4 | 10 | 0 |
| 1 | 0 | 0 | 0 | 0 | 1 | 6 | 0 | 5 | 11 | 1 |
| 1 | 0 | 0 | 0 | 0 | 2 | 0 | 1 | 6 | 12 | 2 |
| 1 | 0 | 0 | 0 | 0 | 3 | 1 | 2 | 7 | 13 | 3 |

With the digital filter apparatus, making use of the RNS system, when the binary code data $D_B$ are continuous, the RNS code data $D_R$ are also changed continuously.

However, the binary code data $D_B$ which is represented when the residue data of any of the moduli of the RNS code data $D_R$ [00000] which stands for [0] of the binary code data proves to be 1 as shown in the following Table 2.

TABLE 2

Binary Code $D_B$ Represented When Residue Data of Any of Moduli of RNS Code Data $D_R$ [00000] is 1

| RNS Code Data $D_R$ | | | | | Binary Code Data $D_B$ | | | | | |
|---|---|---|---|---|---|---|---|---|---|---|
| $m_0$ | $m_1$ | $m_2$ | $m_3$ | $m_4$ | | | | | | |
| 0 | 0 | 0 | 0 | 0 | | | | | | 0 |
| 1 | 0 | 0 | 0 | 0 | 2 | 0 | 5 | 9 | 2 | 0 |
| 0 | 1 | 0 | 0 | 0 | 1 | 9 | 6 | 5 | 6 | 0 |
| 0 | 0 | 1 | 0 | 0 | | 3 | 6 | 9 | 6 | 0 |
| 0 | 0 | 0 | 1 | 0 | 1 | 7 | 6 | 1 | 7 | 6 |
| 0 | 0 | 0 | 0 | 1 | 1 | 0 | 5 | 1 | 0 | 5 |

Thus it is seen that, when the value of the residue data of any of the moduli $m_0$, $m_1$, $m_2$, $m_3$ or $m_4$ of the RNS code data $D_R$ is changed only by one, the value of the associated binary code data $D_B$ is changed drastically.

Hence, with the digital filter apparatus making use of the RNS system, when only one signal bit is shorted with the other signal bit or deteriorated to 0 or 1, the result of decoding becomes significantly different from the true value. For this reason, in case a malfunction occurs in a modulus series or system, it can be estimated only with difficultly in which signal bit of which modulus system the malfunctioning has occurred.

OBJECT AND SUMMARY OF THE INVENTION

In view of the above mentioned inconveniences of the digital filter apparatus making use of the RNS system, it is a principal object of the present invention to provide a digital signal processing circuit in which the input data represented by the binary code is processed after conversion into PNB code which represents the input data by the combination of residues obtained by dividing the input data by plural moduli, and in which, on occurrence of malfunctioning, such as shorting of a signal bit to another signal bit, or deterioration to 0 or 1, the location of the trouble may be estimated by trouble diagnosis. It is a more specific object of the present invention to provide a digital signal processing circuit in which, by observation of the analog signal waveform of the output signal, it can be estimated in which modulus system the trouble has occurred.

For accomplishing the above object, the present invention provides a digital signal processing circuit in which input data represented by the binary code is processed after conversion into the RNS code representing the input data by a combination of residues obtained by dividing the input data by plural moduli and in which, according to the invention, input conversion means for converting the input data into multiples of one or more of the moduli of the RNS code is provided at the input side of the RNS encoder adapted for converting the input data into the RNS code.

With the digital signal processing circuit according to the present invention, the input data of the binary code is converted by input converting means into a multiple of one or more of the moduli $m_i$ of the RNS code. With the digital signal processing circuit, the input data is converted, at the input side of the RNS encoder, into a multiple of one or more of the moduli $m_i$ of the RNS code, so that the output of the modulus $m_i$ system is equal to zero at all times at the output side of the RNS encoder and hence, with the use of ramp waveform data as the input data, the RNS code data is output which corresponds to the binary code having a stepped waveform corresponding to the modulus $m_i$.

The above and other objects as well as the novel features of the present invention will become apparent upon reading the following detailed description in conjunction with the accompanying drawings and the new matter pointed out in the claim.

DETAILED DESCRIPTION OF THE PREFERRED EMBODIMENT

An embodiment of the present invention will be hereinafter explained by referring to the accompanying drawings.

In the present embodiment, a digital filter apparatus of the RNS system, having positive integers $m_0$, $m_1$, $m_2$, $m_3$ and $m_4$, which are prime numbers relative to one another, as moduli in which, on occurrence of a trouble such as shorting of a signal kit to another or deterioration to 1 or 0, the site of such trouble can be estimated by trouble diagnosis.

Figure 1:
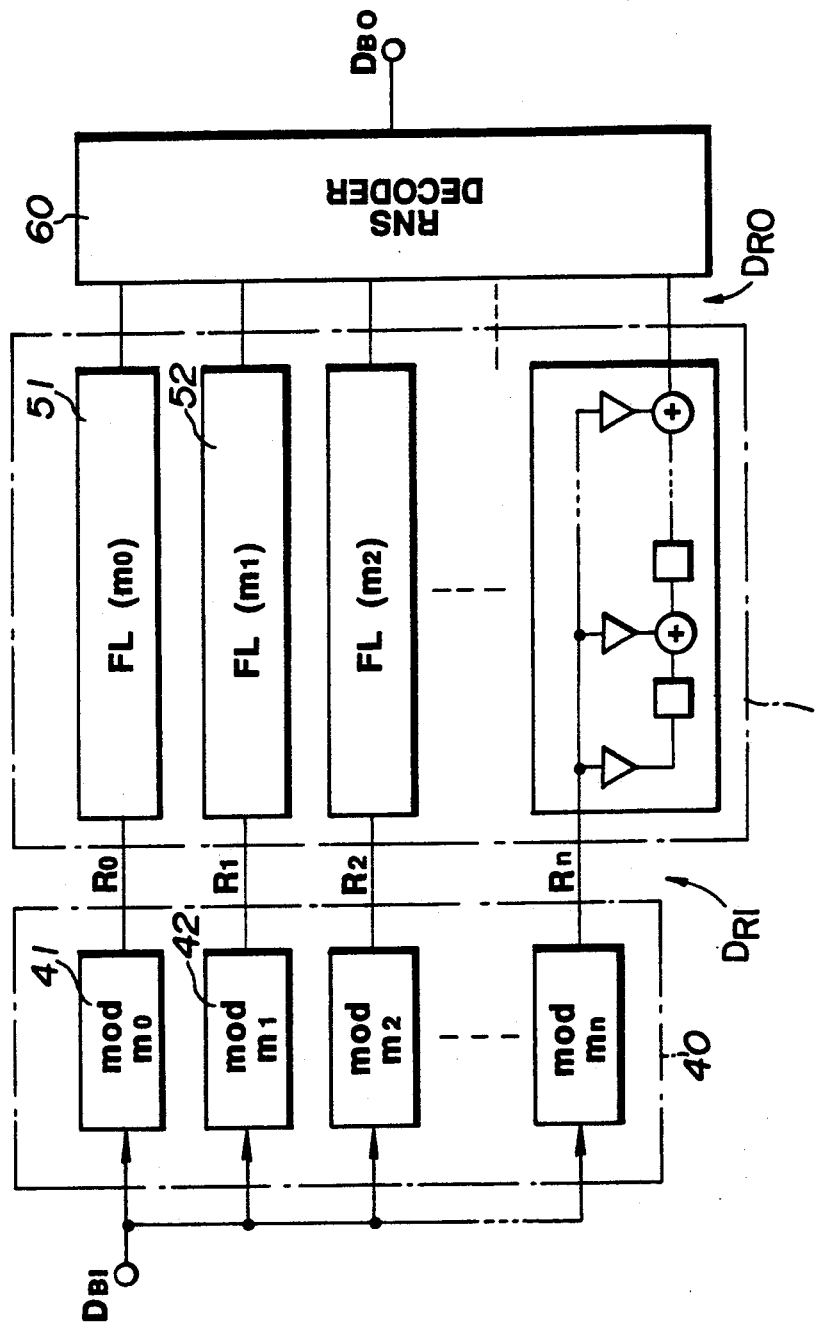
FIG. 1 is a block diagram showing the construction of a conventional digital filter apparatus employed the RNS system.
Figure 2:
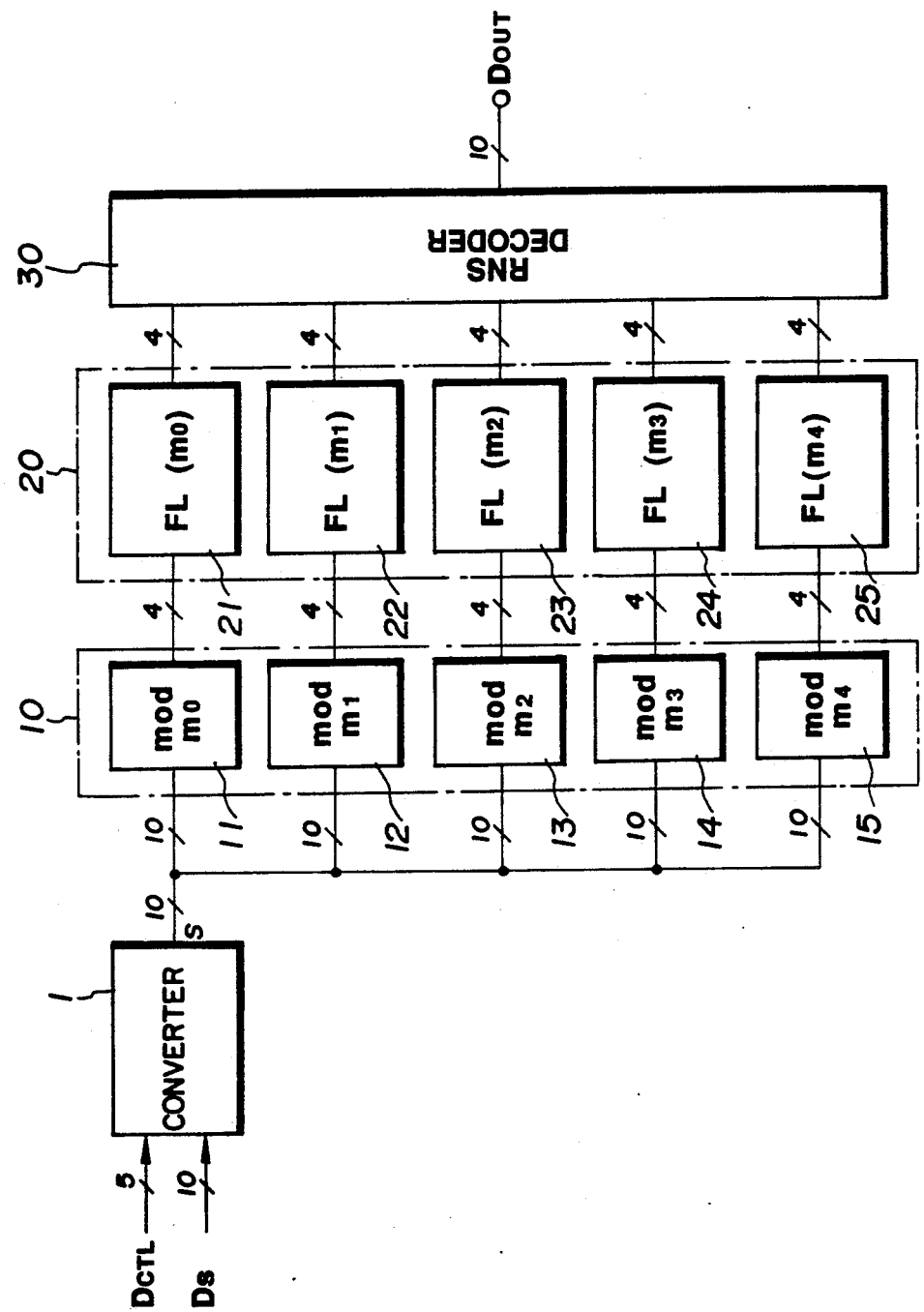
FIG. 2 is a block diagram showing the construction of a digital filter apparatus according to the present invention.

Referring to FIG. 2, the digital signal processing circuit of the present invention is constituted by an input converting section 1 to which binary code data $D_S$ and control data $D_{CTL}$ are entered, an encoder section 10 to which the converted output of the converting section 1 is entered, a filter section 20 to which an encoded output of the encoding section 10 is supplied, and a decoding section 30 to which the output of the filter section 20 is supplied.

The input converting section 1 is constituted by using a conversion table formed by a ROM. The conversion table, employed in the input converting section 1, is constituted by a ROM into which 15-bit conversion table data are written, and to which are entered the lower 10 bit binary code data $D_S$ as the input signal and the upper 5 bit control data $D_{CTL}$ as the control signal.

In the input converting section 1, the lower 10-bit binary code data $D_S$ is subjected, by the above mentioned conversion table, to $2^5 = 32$ modes of converting operations (1) to (6) designated by the above mentioned upper 5-bit control data $D_{CTL}$. These modes may be summarized as follows:

| | | |
|---|---|---|
| (1) | The binary code data $D_S$ is output directly as the binary code output S | one mode |
| (2) | The binary code data S is output in the form of a multiple of $m_i$, where i = 0, 1, . . . , 4 | five modes |
| (3) | The binary code data S is output in the form of a multiple of $m_i \cdot m_j$, where i, j = 0, 1, 2, . . . 4, i≠j | ten modes |
| (4) | The binary code data S is output in the form of a multiple of $m_i \cdot m_j \cdot m_k$, where i, j, k = 0, 1, . . . , 4, i≠j≠k | ten modes |
| (5) | The binary code data S is output in the form of a multiple of $m_i \cdot m_j \cdot m_k \cdot m_l$, wherein i, j, k, l = 0, 1, 2, . . . 4, i≠j≠k≠l | five modes |
| (6) | The binary code data S is output in the form of a multiple of $m_0 \cdot m_1 \cdot m_2 \cdot m_3 \cdot m_4$ | one mode |

The 10-bit binary code data S converted by the input converting section 1, is supplied to the encoding section 10.

The encoding section 10 is constituted by five encoding circuits 11, 12, 13. 14 and 15 to which 10-bit binary code data S supplied from the input converting section 1 are entered as inputs. Each of the encoding circuits 11, 12, 13, 14 and 15 is constituted with the use of a ROM conversion table. The conversion table employed in each of the encoding circuits 11, 12, 13, 14 and 15 is formed by a ROM in which 4-bits of each of the residue data $R_0$, $R_1$, $R_2$, $R_3$ and $R_4$ of the binary code data with positive integers $m_0$, $m_1$, $m_2$, $m_3$ and $m_4$ as the moduli are entered as conversion table data, wherein the integers $m_0$ to $m_4$ are prime numbers with respect to one another.

The binary code data S, entered into the encoding section 10, is converted by the encoding circuits 11, 12, 13, 14 and 15 making use of the conversion table, into each 4-bit residue data $R_0$, $R_1$, $R_2$, $R_3$ and $R_4$, associated with the moduli $m_0$, $m_1$, $m_2$, $m_3$ and $m_4$, respectively.

When the binary code data S are input to the encoder section 10, the RNS code data $D_{RI}$ [$R_0$, $R_1$, $R_2$, $R_3$, $R_4$] is input, which represents the input binary code data in the form of residue data $R_0$, $R_1$, $R_2$, $R_3$ and $R_4$ obtained at the encoder circuits 11, 12, 13 14 and 15.

The RNS code data $D_{RI}$, output from the encoding section 10, is supplied to the filter section 20.

The filter section 20 is constituted by five digital filter circuits 21, 22, 23, 24 and 26. Each of the digital filter circuits 21 to 25 processes the RNS code data $D_{RI}$ supplied from the encoding section 10 by a modulo operation by which the desired same filter characteristics are afforded for each of the residue data $R_0$, $R_1$, $R_2$, $R_3$ and $R_4$ representing the RNS code data $D_{RI}$, that is, for each of the moduli $m_0$, $m_1$, $m_2$, $m_3$ and $m_4$. It is noted that the digital filter circuit 21 performs an arithmetic operation on the residue data $R_0$ with the modulus $m_0$, the digital filter circuit 22 performs an arithmetic operation on the residue data $R_1$ with the modulus $m_1$, the digital filter circuit 23 performs an arithmetic operation on the residue data $R_2$ with the modulus $m_2$, the digital filter circuit 24 performs an arithmetic operation on the residue data $R_3$ with the modulus $m_3$, and the digital filter circuit 25 performs an arithmetic operation on the residue data $R_4$ with the modulus $m_4$.

That is, the filter section 20 processes the RNS code data $D_{RI}$, represented by the combination of $R_0$, $R_1$, $R_2$, $R_3$ and $R_4$, by separate modulo operation for each of the residue data $R_0$, $R_1$, $R_2$, $R_3$ and $R_4$, that is, for each of the moduli $m_0$, $m_1$, $m_2$, $m_3$ and $m_4$. In this manner, each of the residue data supplied with the desired filter characteristics is formed by the digital filter circuits 21, 22, 23, 24 and 25.

The filter section 20 outputs RNS code data $D_{RO}$ representing the input binary code data by the combination of the residue data obtained by the digital filter circuits 21, 22, 23, 24 and 25.

The RNS code data output from the filer section 20 is supplied to the decoding section 30.

This decoder section 30 is constituted with the use of the conversion table formed by a ROM. The conversion table employed in the decoding section 30 is constituted by a ROM in which binary code data corresponding to the RNS code data are written as conversion table data.

The decoding section 30 outputs the RNS code data $D_{RO}$, supplied from the filter section 20, after conversion thereof into 10-bit binary code data $D_{OUT}$ with the aid of the conversion table.

The above described digital filter apparatus functions as the normal digital filter under the condition in the control data $D_{CTL}$ of the mode (1) is supplied to the input converting section 1 to cause the input binary data $D_S$ to be supplied directly to the encoding section 10 as the converted binary code data S. This is the normal operating mode.

With this normal mode, the encoding section 10 causes the blnary code data S, that is, the input binary code data $D_S$, to be converted directly into RNS code data $D_{RI}$. The filter section 20 performs a modulo operation for imparting desired filter characteristics to the RNS code data $D_{RI}$ so that the RNS code data $D_{RO}$ on which the modulo operation has been performed by the filter section 20 is converted by the decoding section 30 into the output binary code data $S_{OUT}$.

The state in which the control data $D_{CTL}$ of the modes (2), (3), (4), (5) and (6) causing the binary code data S supplied to the encoding section 10 to be converted into multiples by one or more of the moduli $m_0$, $m_1$, $m_2$, $m_3$ and $m_4$ is supplied to the input converting section 1, represents a trouble diagnostic mode for estimating the site of trouble in case of an occurrence of a trouble such as shorting of a signal bit with another signal bit or deterioration to 0 or 1. with this trouble diagnostic mode, the following trouble diagnostic operation may be performed.

That is, with the present digital filter apparatus, when the binary code data S converted by the input converting section 1 into a multiple of the modulus $m_0$, for example, is supplied to the encoding section 10, the output $R_0$ of the encoding circuit 11 of the encoding section 10 with the modulus $m_0$ is zero ($R_0=0$) and the output of the filter circuit 21 with the modulus $m_0$ of the filter section 20 is also zero, while the binary code data $D_{OUT}$, output from the decoding section 30, is a multiple of the modulus $m_0$.

Figure 3A:
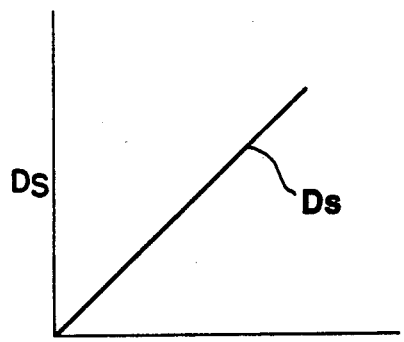
FIGS. 3A and 3B are waveform diagrams for illustrating the operation of the trouble diagnostic mode in the digital filter apparatus shown in FIG. 2.
Figure 3B:
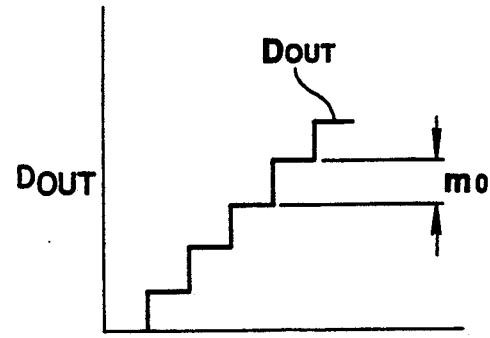

Hence, if the ramp waveform data shown FIG. 3A is used as the binary code data $D_S$ supplied to the input converting section 1, the binary code data $D_{OUT}$ output from the decoding section 30 proves to be a step wave having a step difference corresponding to the modulus $m_0$, as shown in FIG. 3B.

In case of trouble caused by shorting of a modulus $m_0$ system signal, for example, with another signal or of signal deterioration to zero, supposing that the input converting section 1 is operated under the operating mode (1) and the binary code data $D_S$ having the ramp waveform is supplied directly as the binary code data S to the encoding section 10 via input converting section 1, the binary code data $D_{OUT}$ output from the decoding section 30 exhibits a drastically disturbed waveform. Conversely, when the input converting section 1 is operated under the trouble diagnostic mode (2) so that the binary code data $D_S$ is multiplied by the modulus $m_0$ into the binary code data S, which is then supplied to the encoding section 10, the output of the system of the modulus $m_0$ is forced to be zero. Thus the b1nary code data $D_{OUT}$ output from the decoding section 30 presents a neat step waveform. Thus, by observing the output waveform of the binary code data $D_{OUT}$ output from the decoding section 30, it may be estimated that trouble has occurred in the system of the modulus $m_0$. In addition, the waveform of the signal bit of the system with the modulus $m_0$ may be observed to estimate the signal bit where the trouble has occurred.

The above described procedure is repeated for each of the systems with the moduli $m_0$, $m_1$, $m_2$, $m_3$ and $m_4$ and, when the waveform disturbed with the normal operating mode (1) should present a neat step wave with the trouble diagnostic mode (2), the trouble has occurred in the system of the modulus designated at this time.

When the signal shorting or deterioration to zero has occurred in two or more modulus systems, the output waveform represented by the binary code data $D_{OUT}$ output from the decoder 30 is disturbed during the normal operating mode (1), whereas, when the binary code data S converted at the input converting section 1 into a multiple of the product of the corresponding moduli at the trouble diagnostic modes (3), (4) and (5) is supplied to the encoding section 10, the binary code data $D_{OUT}$ output by the decoder section 30 presents a neat step waveform. Thus, the system of the modulus where the trouble has occurred may be estimated by observing the waveform of the output waveform represented by the binary code data $D_{OUT}$.

In addition, the occurrence of trouble in which the signal of a system of a modulus is deteriorated to 1 may be detected by operating the input converting section 1 at the trouble diagnostic mode (6) and supplying the binary code data S, which is set to zero (S=0), to the encoding section 10.

That is, when the systems of the moduli $m_0$, $m_1$, $m_2$, $m_3$ and $m_4$ are operating normally, the binary code data $D_{OUT}$, output from the decoder section 30, becomes zero ($D_{OUT}=0$). whereas if "1" is set in any modulus system, as a result of trouble occurrence, $D_{OUT}0$. Thus, it suffices to find the signal bit where "1" is set by waveform observation, such as by means of an oscilloscope. It is also possible to divide the value of the binary code data $D_{OUT}$, output by the decoder section 30, by the moduli $m_0$, $m_1$, $m_2$, $m_3$ and $m_4$, to find out a system of a modulus with a remainder to estimate that the trouble has occurred in this system.

It is noted that the trouble in the digital filter apparatus of the RNS system in general occurs most frequently in one modulus system and that the frequency of the trouble occurring across plural modulus systems becomes lower the more the number of the modulus systems across which the trouble occurs. Therefore, the number of the trouble diagnostic modes may be limited appropriately. For example, by limiting the operating modes to the normal operating mode (1) and to the trouble diagnostic modes (2) and (6), the input converting section 1 may be operated under seven operating modes and control may be made by 3-bit control data $D_{CTL}$.

Although the input converting section 1 and the encoding section 10 are constituted by separate ROM conversion tables, the 10-bit binary code data $D_S$ supplied as the input signal may be divided into upper 5 bits and lower 10 bits and the input conversion may be performed for each of the moduli $m_0$, $m_1$, $m_2$, $m_3$ and $m_4$, while the function of input conversion may be combined with the RNS encoding function to thereby reduce the ROM capacity.

Figure 4:
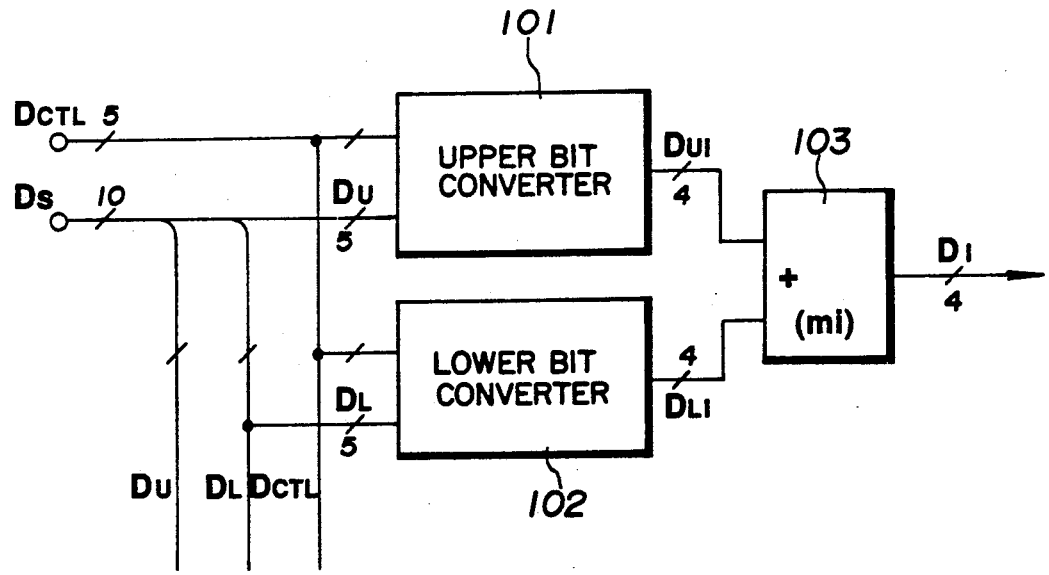
FIG. 4 is a block diagram showing essential portions of a modified embodiment of the digital filter apparatus according to the present invention.

FIG. 4 shows the construction of a section taking charge of both the input conversion and the RNS encoding of a system of a modulus $m_i$, hereinafter referred to as $m_i$ converting section.

The $m_i$ converting section shown in FIG. 4 is constituted by an upper 5 bit converting circuit 101 to which an upper five bits of the 10-bit binary code data $D_S$, applied as the input signal, are supplied, a lower 5 bit converting circuit 102 to which lower five bits of the binary code data $D_S$ are supplied, and an encoding output stage 103 to which the conversion outputs of the conversion circuits 101 and 102 are supplied.

The upper bit conversion circuit 101 is constituted by using a ROM conversion table. The conversion table employed in the upper bit conversion circuit 101 is constituted by a ROM into which a 10-bit conversion table is recorded, and lo which the upper 5-bit data $D_U$ of the 10-bit binary code data $D_S$, applied as the input signal, and the 5-bit control data $D_{CTL}$, are supplied as the inputs.

The upper bit converting circuit 101 processes the upper 5-bit data $D_U$, with the aid of the conversion table, for converting the upper 5-bit data $D_U$ into 4-bit upper residue data $D_{ui}$ in $2^5=32$ modes (1) to (6) designated by the control data $D_{CTL}$.

(1) The value $S_U$ of the upper 5-bit data $D_U$ is converted into upper residue data $D_{ui}$ shown by the formula (6)

$$C_{ui} = (S_u \times 2^5) \bmod m_i \quad (6)$$
...one mode (2) The value $S_U$ is converted into upper residue data $D_{ui}$ of a value $C_{ui}$ shown by the formula (7)

$$C_{ui} = \{(S_u \times 2^5)/m_i \cdot m_j\} \bmod m_i \quad (7)$$
$(i = 0, 1, \ldots, 4)$ ...5 modes (3) The value $S_U$ is converted into upper residue data $D_{ui}$ of a value $C_{ui}$ shown by the formula (8)

$$C_{ui} = \{(S_u \times 2^5)/(m_j \cdot m_k) \cdot (m_j \cdot m_k)\} \bmod m_i \quad (8)$$
$(i, k = 0, 1, \ldots, 4, i \neq k)$ ...10 modes (4) The value $S_u$ is converted into the upper residue data $D_{ui}$ of the value $C_{ui}$ shown by the formula (9)

$$C_{ui} = \{(S_u \times 10^5)/(m_j \cdot m_k \cdot k_l) \cdot (m_j \cdot m_k \cdot m_l)\} \bmod m_i \quad (9)$$
$(j, k, l = 0, 1, \ldots, 4, j \neq k \neq l)$ ...10 modes (5) The value $S_u$ is converted into the upper residue data $D_{ui}$ of the value $C_{ui}$ shown by the formula (10)

$$C_{ui} = \{(S_u \times 10^5)/(m_j \cdot m_k \cdot k_l \cdot m_n) \cdot (m_j \cdot m_k \cdot m_l \cdot m_n)\} \bmod m_i \quad (10)$$
$(j, k, l, n = 0, 1, \ldots, 4, j \neq k \neq l \neq n)$ ...5 modes (6) The value $C_i$ is set to zero (the value of $C_{ui}$ is converted into a multiple of $(m_0 \cdot m_1 \cdot m_2 \cdot m_3 \cdot m_4)$ The 4-bit upper residue data $D_{ui}$, converted by the bit converting circuit 101, is supplied in this manner to the encoding output stage 103.

The lower bit converting circuit 102 is constituted by using a ROM conversion table. The conversion table, employed in the lower bit conversion circuit 102, is constituted by a ROM in which 10-bit conversion table data are written and to which are entered the lower 5-bit data $D_L$ of the 10-bit binary code data $D_S$ applied as the input signal, and the 5 bit control data $D_{CTL}$.

The lower bit converting circuit 102 causes the upper 5-bit data $D_L$ to be converted by the conversion table into 4-bit lower residue data $D_{Li}$ in $2^5=32$ modes (1) to (6) designated by the control data $D_{CTL}$. These modes may be summarized as follows:

(1) The value $S_L$ of the lower 5-bit data $D_L$ is converted into lower residue data $D_{Li}$ shown by the formula (11)

$$C_{Li} = S_L \bmod m_i \quad (11)$$

(2) The value $S_L$ is converted into lower residue data $D_{Li}$ of a value $C_{Li}$ shown by the formula (12)

$$C_{Li} = \{(S_U \times 2^5)/m_i \cdot m_j\} \bmod m_i \quad (12)$$
$(i = 0, 1, \ldots, 4)$ ...5 modes (3) The value $S_L$ is converted into lower residue data $D_{Li}$ of a value $C_{Li}$ shown by the formula (13)

$$C_{Li} = \{(S_u \times 2^5)/(m_j \cdot m_k) \cdot (m_j \cdot m_k)\} \bmod m_i \quad (13)$$
$(i, k = 0, 1, \ldots, 4, i \neq k)$ ...10 modes (4) The value $S_L$ is converted into the lower residue data $D_{Li}$ of a value $C_{ui}$ shown by the formula (14)

$$C_{Li} = \{(S_u \times 10^5)/(m_j \cdot m_k \cdot m_l) \cdot (m_j \cdot m_k \cdot m_l)\} \bmod m_i \quad (14)$$
$(i, k, = 0, 1, \ldots, 4, i \neq k \neq l)$ ...10 modes (5) The value $S_L$ is converted into the lower residue data $D_{Li}$ of the value $C_{Li}$ shown by the formula (15)

$$C_L = \{(S_u \times 10^5)/(m_j \cdot m_k \cdot k_l \cdot m_n) \cdot (m_j \cdot m_k \cdot m_l \cdot m_n)\} \bmod m_i \quad (15)$$
$(j, k, , n = 0, 1, \ldots, 4, j \neq k \neq l \neq n)$ ...5 modes (6) The value $C_{ui}$ is set to zero (the value of $C_{ui}$ is converted into a multiple of $m_0 \cdot m_1 \cdot m_2 \cdot m_3 \cdot m_4$) ... 1 mode The 4-bit lower residue data $D_{Li}$, thus converted by the lower bit conversion circuit 102, are supplied to the encoding output stage 103.

The encoding output stage 103 is constituted by a conversion table by a ROM. The conversion table, employed in the encoding output stage 103, is constituted by a ROM in which are written conversion table data for converting the upper residue data $D_{Ui}$ and lower residue data $D_{Li}$ supplied from the conversion circuits 101, 102 into output residue data $D_i$ of a value $R_i$ shown by the formula (16)

$$R_i = (C_{Ui} + C_{Li}) \bmod m_i \quad (16)$$

The residue data $D_i$, output from the encoding output stage 103, are supplied as the RNS code data of the modulus $m_i$ to a filter section, not shown.

When the 10-bit binary code data $D_S$, supplied as the input signal, is divided into upper 5 bits and lower 5 bits, an input converting operation is performed for each of the moduli $m_0$, $m_1$, $m_2$, $m_3$ and $m_4$, and the encoding function is combined with the input converting function, the data volume of the conversion table employed in each of the converting circuits 101. 102 in a $m_i$ converting section for a modulus $m_i$ is $(2^{10} \times 4) \times 2$ bits, whereas the data volume of the conversion table of the encoding output stage 103 is $2^8 \times 4$ bits. Hence, when the digital filter apparatus is constructed by systems of five moduli $m_0$, $m_1$, $m_2$, $m_3$ and $m_4$, the RNS encoding and input conversion for the operation of the normal operational mode (1) and the trouble diagnostic modes (2) to (6) similar to those of the embodiment of FIG. 2 may be performed by using a conversion table formed by a ROM having a storage capacity of $\{(2^{10} \times 4) \times 2 + 2^8 \times 4\} \times 5 = 46,080$ bits.

It is noted that, in the embodiment shown in FIG. 2, $2^{15} \times 10$ bits and $2^{10} \times 4 \times 5$ bits are necessitated for the conversion tables employed in the input converting section 1 and the encoding section 1, respectively, so that it is necessary to provide a ROM having a total storage capacity of 340,160 bits.

Although a variety of different constructions may be conceived for the decoder 30 in the signal processing circuit shown in FIG. 2, a decoder shown for example in Japanese Patent Application 62-287101 (1987) published as Japanese Publ. No. 1-126,829, may be employed in the signal processing circuit of FIG. 2.

Meanwhile, in this type of the decoder, binary data may be output with rounding below a predetermined bit. The construction of this rounding operation is disclosed in the Japanese Patent Application 62-287101.

A construction of the rounding is hereinafter explained by referring to the drawings.

Figure 5:
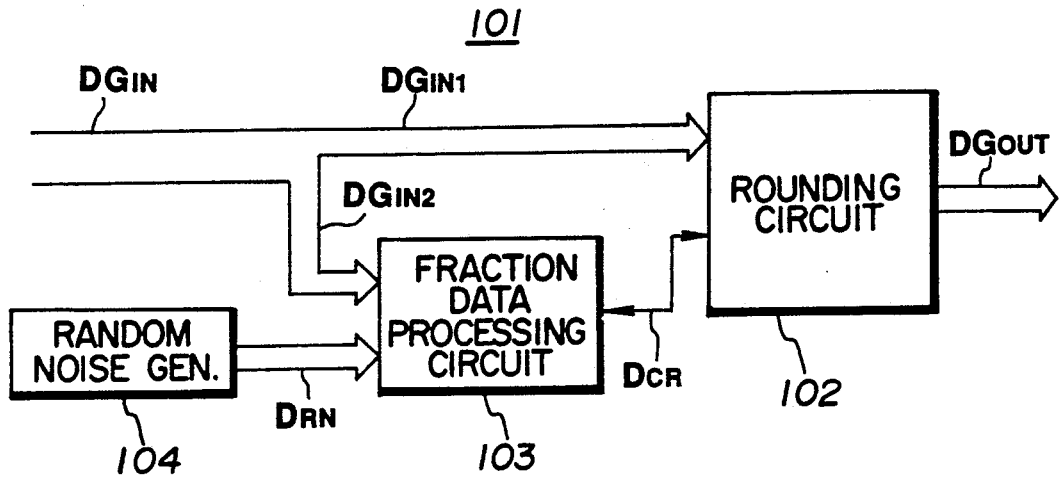
FIG. 5 is a block diagram showing an example of the construction of a decoder in the digital filter apparatus shown in FIG. 2.

Referring to FIG. 5, a digital data processing circuit 101 of the present embodiment performs predetermined rounding on, for example, 16-bit input digital data $DG_{IN}$ to produce output digital data $DG_{OUT}$ constituted by 8 effective bits.

Thus the 8-bit effective data $DG_{IN1}$, starting from the 16-bit input digital data $DG_{IN}$ to be rounded are entered into a rounding circuit 102.

The fractional number data $DG_{IN2}$, constituted by 8 bits lower than the effective data $DG_{IN1}$ of the input digital data $DG_{IN}$, are entered into a fractional number data processing circuit 103.

Besides the fractional number data $DG_{IN2}$, random noise data $D_{RN}$ of, for example, 3 bits, output from a random noise generating circuit 104, are also entered into the fractional data processing circuit 103.

In practice, the rounding circuit 102 and the fractional number data processing circuit 103 are configured as the adder, with the fractional data processing circuit 103 adding the 3 bits from the most significant bit (MSB) of the fractional number data $DG_{IN2}$ to the random noise data $D_{RN}$ to produce a 1-bit carry data $D_{CR}$ indicating a carry information. This carry data is transmitted to the rounding circuit 102.

The rounding circuit 102 adds the carry data $D_{CR}$ transmitted from the circuit 103 at the least significant bit (LSB) of the effective data $DG_{IN1}$ of the input digital data $DG_{IN}$ to transmit the thus produced 8-bit data as an output digital data $DG_{OUT}$ formed by the rounded effective data.

It is noted that the random noise generating circuit 104 is constituted by a multi-element M (maximal length pulse) sequences generating circuit adapted for making use of a primitive polynominal on a Galois field (CF)p)).

Meanwhile, with the Galois field CF(p), p is selected to be a prime number, and the generated series values are $0, 1, 2, \ldots, p-1$.

By selecting the number p to be a prime number, the self correlation function of the series is 1 for an integer multiple of the period f and $-1/f$, otherwise so as to have the properties as the so called pseudo noise series.

In this case, the prime number p is selected in accordance with the formula (17)

$$P = 2^n + 1 \qquad (17)$$

where n is an arbitrary integer, or the formula (18)

$$P = 2^n - 1 \qquad (18)$$

and the resulting n-bit series value is added to the n bits from MSB of the fractional number data $DG_{IN2}$.

In this manner, the mean value of the series values, added or not added to 1, is roughly coincident with the central value of the n-bit value from MSB of the fractional number data $DG_{IN2}$. Thus, the probability of the occurrence of the carries in the fractional number data processing circuit 103 may be averaged.

Figure 6:
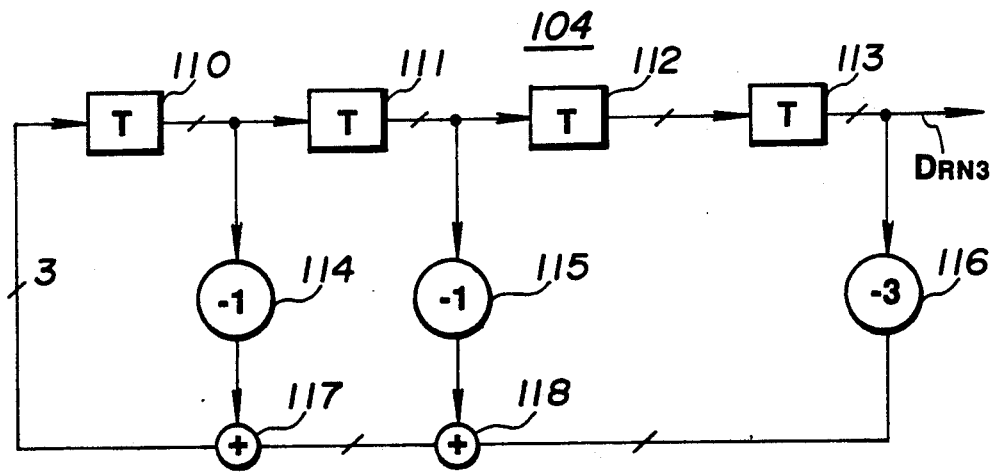
FIG. 6 is a block diagram showing an example of the construction of a random noise generator in the decoder shown in FIG. 2.

The random noise generating circuit 104 of the present embodiment is constituted by a 7-element 3-degree M sequences generating circuit, with n and p equal to 3 and 7, respectively, as shown in FIG. 6. In practice, the generating circuit 104 is constituted by a linear cyclic shift register including four latch circuits 110 to 113, three modulus multipliers 114 to 116 performing a modulo 7 operation, and two adders 117, 118, and is constructed so as to have the following formula (19)

$$x^4 + x^3 + x^2 + 3 \qquad (19)$$

as the primitive polynominal.

The period f may be expressed in this case by the following formula (20)

$$f = 7^4 - 1 = 2400 \qquad (20)$$

while the average value $A_v$ of the generated 3-bit series values 0 to 6 is given by the following formula (21)

$$A_v = \frac{0 \times (7^3 - 1) + 1 \times 7^3 + 2 \times 7^3 + \ldots + 6 \times 7^3}{7^4 - 1} \qquad (21)$$
$$= 3.00125$$

A value 1 is added to each of the series values 0 to 6 and the resulting values 1 to 7 are transmitted as the random noise data $D_{RN3}$, with the average value being 4.00125 ($\approx 4.0$).

Figures 7, 8:
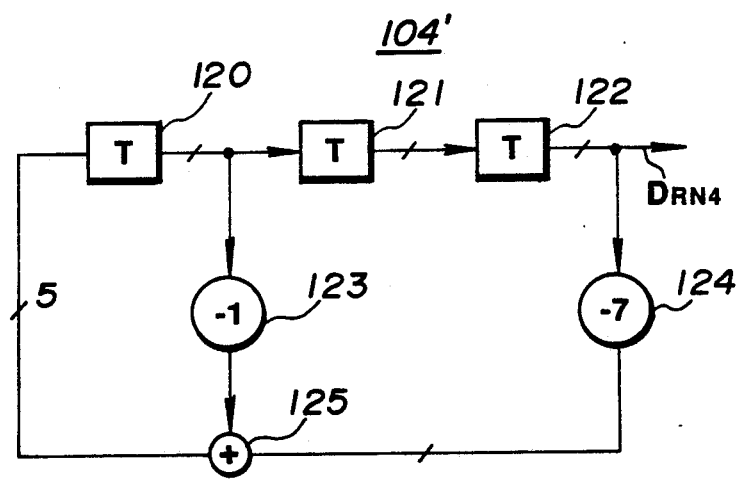
FIG. 7 shows the state of occurrence of a carry in a fractional number data processing circuit in the decoder shown in FIG. 2.
FIG. 8 is a block diagram showing another example of the construction of another random noise generating circuit in the decoder shown in FIG. 2.

In this case, on adding the random noise data $D_{RN3}$ to the 3 bits from the MSB of the fractional number data $DG_{IN2}$, the carry occurs as shown in a diagram of FIG. 7.

In the diagram of FIG. 7, "1" indicates occurrence of a carry and "0" the non-occurrence of a carry.

It may be seen from the diagram that the case of occurrence of a carry and the case of non-occurrence of a carry become symmetrical relative to each other between the values "3" and "4" of the three bits from the MSB of the fractional number data $DG_{IN2}$, so that the probability of the occurrence of a carry is $\frac{1}{2}$ as a whole.

On the other hand, the larger the value of the three bits from the MSB of the fractional number data $DG_{IN2}$, the higher is the probability of the occurrence of the carry, so that errors may be reduced from the statistical point of view.

It is noted that the above described half-adjust technique corresponds to the left side half and the right side half of the diagram being "0" and "1", respectively, with the probability of carry occurrence being deviated as a function of the value of the three bits from the MSB of the factional number data $DG_{IN2}$.

It is noted that, when the value of the three bits from the MSB of the fractional number data $DG_{IN2}$ is "7", carry occurs irrespective of the value of the random noise data $D_{RN3}$, whereas, when the above value is "0", carry cannot occur irrespective of the value of the random noise data $D_{RN3}$.

Thus, a digital data processing circuit 101 capable of averaging out the occurrences of the rounding errors irrespective of the fractional number data $DG_{IN2}$ may be implemented by the above described construction in which 3-bit random noise data $D_{RN3}$ generated by a random noise generator 104 constituted by 7-element 3-degree M series generator is added to the three bits from the MSB of the fractional number data $DG_{IN2}$ of the digital data $DG_{IN}$ and the carry data $D_{CR}$ formed by the result of the addition is added to the LSB of the effective data $DG_{IN1}$ of the digital data $DG_{IN}$ to produce the output digital data $DG_{OUT}$.

Although the random noise generator 104 is constituted by a 7-element 3-degree M sequences generating circuit in the above embodiment, any other multi-element sequences generating circuit may also be employed.

FIG. 8 shows for example, a 17-element 4-degree M series generating circuit 104', with n and p being 4 and 17, respectively. In practice, the circuit 104' is a linear cyclic shift register constituted by three latch circuits 120 to 122, two modulus multiplication circuits 123, 124 each performing a modulo 17 operation, and an adder 125, and is configured to have the following formula (22)

$$x^3 + x^2 + 7 \qquad (22)$$

as the primitive polynominal.

In this case, the period f is represented by the following formula (23)

$$f = 17^3 - 1 = 4912 \qquad (23)$$

and the average value of the generated 4-bit series values is represented by the following formula (24)

$$A_v = \frac{0 \times (17^2 - 1) + 1 \times 7^2 + \ldots + 16 \times 17^2}{17^3 - 1} \qquad (24)$$
$$= 8.00163 \approx 8.0$$

In this case, the series values are 0 to 16, which are added as the random noise data $D_{RN4}$ to the four bits from the MSB of the fractional number data $DG_{IN2}$.

Thus, with the series value of "16", the carry occurs irrespective of the value of the four bits from the MSB of the fractional number data $DG_{IN2}$, whereas, with the series value of "0", the carry does not occur irrespective of the value of the four bits from the MSB of the fractional number data $DG_{IN2}$.

Hence, the value "1" may be added to the LSB of the effective data $DG_{IN1}$ at the probability of 1/17, even when the input digital data $DG_{IN}$ is not entered. In practice, for effectively avoiding such addition, the series values "16" and "0" are converted into values "15" and "1", respectively.

In this case, the average value is given by the following formula (25)

$$A_v = \frac{0 \times (17^2 - 1) + 1 \times 7^2 + \ldots + 15 \times 17^2}{17^3 - 1} \qquad (25)$$
$$= 8.00143 \approx 8.0$$

In the above described embodiment, the rounding operation is performed solely by the digital data processing circuit 101. Instead, when a plurality of rounding operations are performed in the same digital data processing system, the random noise generating circuits 104 and 104' may be constituted by multi-element M sequences generating circuits which are not correlated with one another, in which case it becomes possible to prevent peculiar level increase or decrease of the digital data which might otherwise be caused when the circuit is constructed by the same multi-element M sequences generating circuits.

With the above described rounding circuits, a digital data processing circuit capable of averaging out the occurrences of rounding errors irrespective of the value of the fractional number data may be provided by a simplified construction in which the random noise generated by the multi-element M sequences is added to the fractional number data of the digital data and the digital data rounding is performed on the basis of the results of the addition.

The above described digital signal processing circuit according to the present invention has the function of converting input data into a multiple of one or more of the moduli $m_i$ of the RNS code by input converting means provided at an input stage of an encoder adapted for converting the input data into RNS code data, whereby the output of the series of the modulus $m_i$ is forced to be zero, so that, with the use of ramp waveform data as the input data, a stepped waveform output having a step difference corresponding to the modules $m_i$ may be obtained. Hence, with the present digital signal processing circuit, on shorting of a signal bit with another signal bit or deterioration of a signal bit is 0 or 1, the waveform of the output for the above mentioned ramp waveform input data may be observed and compared with respect to the operating state and non-operating state of the input converting means to estimate at which signal bit of which modulus series the trouble is occurring.

What is claimed is:

1. A digital signal processing apparatus for processing input data composed of binary codes, comprising:
   converting means for converting said input data into a converted value which is a multiple of a selected one of residue number system (RNS) moduli;
   control means for selecting one or more of said input data or said converted values of said input data on the basis of selected moduli;
   RNS encoding means supplied with an output of said control means for generating residue data for said RNS moduli, and
   processing means for processing said residue data for generating processed data.

2. A digital signal processing apparatus according to claim 1, wherein said processing means includes digital filter means.

3. A digital signal processing apparatus according to claim 1, wherein said converting means is constituted by a read only memory (ROM) for receiving m-bit binary code data and n-bit control data as inputs and in which memory means (m+n) bit conversion table data are written.

4. A digital signal processing apparatus according to claim 1, wherein said converting means includes an upper bit converting section constituted by a read only memory (ROM) for receiving an upper $m_1$ bit data of $(m_1+m_2)$ bit binary code data and n bit control data as inputs and in which memory means $(m_1+n)$ bit conversion table data are written, and including a lower bit converting section for receiving the lower $m_2$ bit data of said $(m_1+m_2)$ bit binary code data and n bit control data as inputs and in which memory means $(m_2+n)$ bit conversion table data are written.

5. A data processing circuit for rounding effective data composed of a predetermined number of bits from the most significant bit (MSB) of digital data, comprising:
   noise generating means for generating multi-element M series noises composed of a predetermined number of bits;

first means for adding the multi-element M series noise from said noise generating means to a predetermined number of bits from the MSB of fractional number data which are composed of the bits lower in number than said predetermined number of bits of said digital data;

means for generating carry data from the output of said first adder means; and second means for adding said carrying data to the LSB of said effective data.

6. A digital signal processing circuit for processing input data composed of binary code data, comprising:

converting means for converting said input data into a converted value which is a multiple of a selected one of a residue number system (RNS) moduli;

an RNS encoding means receiving the output of said converting means for generating residue data for said RNS moduli, whereby the output of the series of the modulus $M_i$ is forced to be zero so that, with the use of ramp waveform data as the input data, a stepped waveform output having a step difference according to the modulus $M_i$ is obtained, and so that, upon changing of a signal bit to zero or 1 by either shorting of a signal bit with another signal bit or deterioration of said signal bit, the waveform of the output for the above-mentioned ramp waveform input data with respect to the operating state and non-operating state of the converting means provides an estimate at which signal bit of which moduli trouble is occurring.

7. A digital signal processing circuit for processing input binary code data composed of a binary codes, comprising:

an input converting circuit to which binary code data and control data are entered for converting the binary code data into an output comprising either or both of said binary code data and a converted value of said binary code data which is a multiple of a selected residue number system (RNS) moduli;

an RNS encoding means for receiving the converted value of the binary code data from the input converting section for generating residue data associated with said respective RNS moduli to produce RNS code data representative thereof;

a filter for receiving said RNS code data from said encoding means for processing said RNS code data by a modulo operation; and a decoding means for receiving said RNS code data from the filter representing the input binary code data and providing processed data representative of said input binary code data.

8. A digital signal processing apparatus according to claim 7, wherein said input converting means includes a read only memory (ROM) for receiving m-bit binary code data and n-bit control data as inputs and in which memory (m+n) bit conversion table data are written.

9. A digital signal processing apparatus according to claim 7, wherein said input converting means includes an upper bit converting section constituted by a read only memory (ROM) for receiving upper $m_1$ bit data of $(m_1+m_2)$ bit binary code data and n bit control data as the input and in which memory $(m_1+n)$ bit conversion table data are written, and a lower bit converting section to which the lower $m_2$ bit data of said $(m_1+m_2)$ bit binary code data and n bit control data are entered as the inputs and in which memory $(m_2+n)$ bit conversion table data are written.

10. The circuit as set forth in claim 7 wherein, if binary code data supplied to said input converting section is ramp waveform data, the binary code data output from the decoding means is a step wave having a step difference corresponding to the modulus $m_0$.

11. The circuit as set forth in claim 7 wherein said input data is repeated for each of the respective moduli to determine signal alteration by shorting or deterioration to zero in at least one modulus system.

* * * * *